(12) United States Patent
Terada et al.

(10) Patent No.: US 6,411,455 B1
(45) Date of Patent: *Jun. 25, 2002

(54) HEAD AMPLIFIER CIRCUIT

(75) Inventors: Yukihiro Terada; Akira Ikeuchi, both of Atsugi (JP)

(73) Assignee: Mitsumi Electric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,075

(22) Filed: Mar. 11, 1998

(30) Foreign Application Priority Data

Mar. 18, 1997 (JP) ............................................... 9-065134

(51) Int. Cl.[7] .............................. G11B 5/02; G11B 5/09
(52) U.S. Cl. ......................................... 360/68; 360/46
(58) Field of Search ..................................... 360/46, 68

(56) References Cited

U.S. PATENT DOCUMENTS 5,638,012 A * 6/1997 Hashimoto et al. ........... 360/68
5,822,141 A * 10/1998 Chung et al. ................. 360/46
5,852,526 A * 12/1998 Huntington ................... 360/46

* cited by examiner

*Primary Examiner*—David Hudspeth
*Assistant Examiner*—Dan I. Davidson
(74) *Attorney, Agent, or Firm*—Ladas & Parry

(57) ABSTRACT

A head amplifier circuit supplies a writing current, having a direction in accordance with recording information, to a head for recording information on a recording medium. The head amplifier circuit includes a reference voltage generating portion for generating a reference voltage, a constant current generating portion for generating a constant current based on the reference voltage generated by the reference voltage generating portion, and a grounding portion. During one period of time, the constant current generating portion supplies the constant current to a first end of the head and the grounding portion grounds a second end of the head. During another period of time, the constant current generating portion supplies the constant current to the second end of the head and the grounding portion grounds the first end of the head.

6 Claims, 3 Drawing Sheets

|   | Q1 | Q2 | Q3 | Q4 |
|---|----|----|----|----|
| a | 1  | 0  | 0  | 1  |
| b | 1  | 0  | 0  | 0  |
| c | 0  | 1  | 0  | 0  |
| d | 0  | 1  | 1  | 0  |

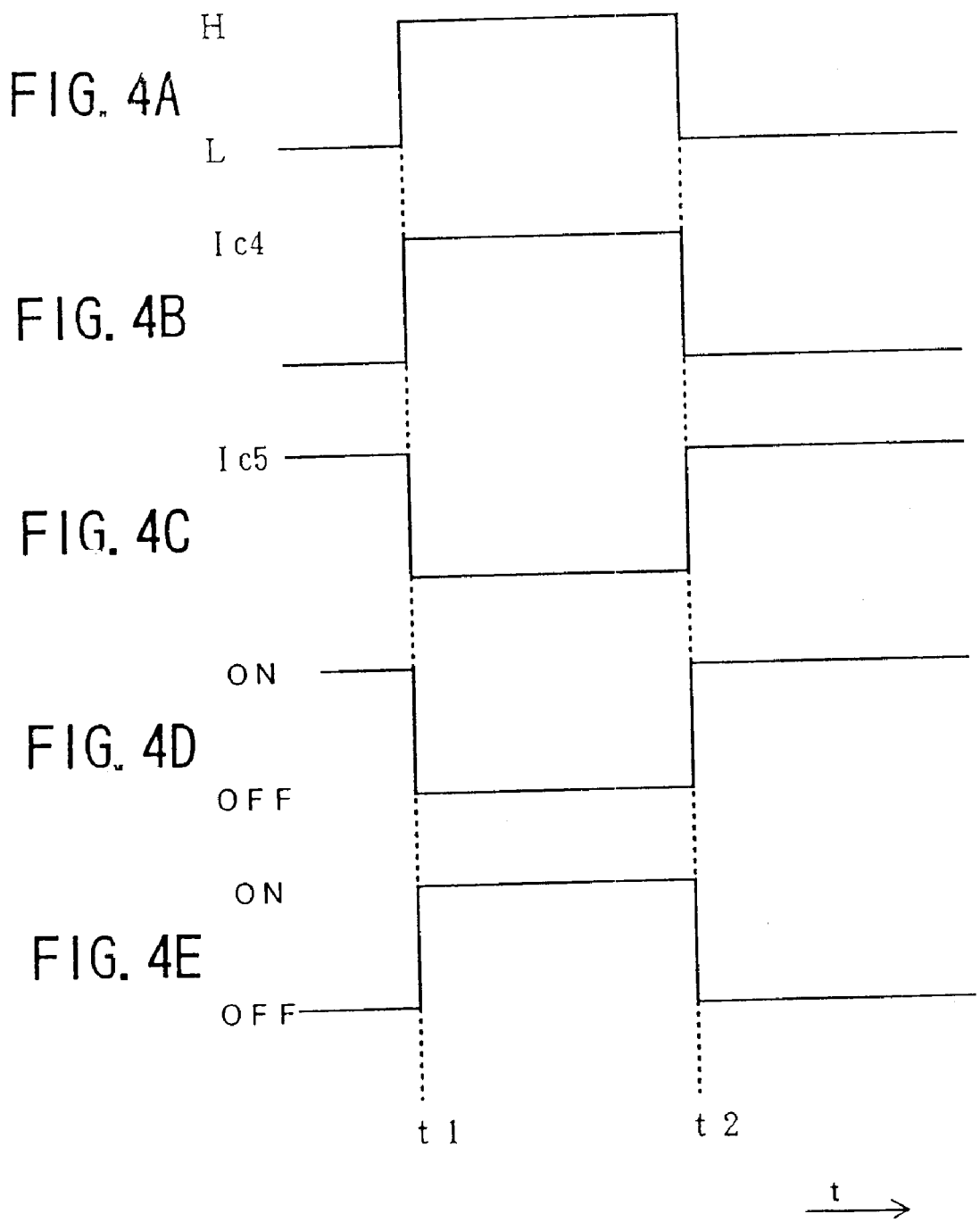

HEAD AMPLIFIER CIRCUIT

BACKGROUND OF THE INVENTION

1. Field of the Invention

The present invention relates to a head amplifier circuit, and, in particular, to a head amplifier circuit which supplies a writing current to a head which records a digital signal on a recording medium.

2. Description of the Related Art

In a floppy disk drive, a digital signal is converted into a magnetic field through a magnetic head, and is recorded on a floppy disk. At this time, by switching transistors in accordance with the digital signal, the writing current supplied to the magnetic head alternately flows or does not flow. Thereby, the magnetic field generated in the magnetic head is controlled, and writing of information on the floppy disk is performed.

FIG. 1 shows a circuit diagram of one example of a head amplifier circuit in the related art.

The head amplifier circuit 1 in the related art includes a plurality of switching transistor Q1 through Q4. Switching of the switching transistor Q1 through Q4 is performed in accordance with a digital signal, and switching control of a writing current supplied to the magnetic head 2 is performed. The head amplifier circuit 1 further includes an external resistor Ra, connected in series with the magnetic head 2, for controlling the writing current supplied to the magnetic head 2.

The switching transistor Q1 is an NPN transistor, the emitter being grounded, the collector being connected with one end of the magnetic head 2 and connected with the collector of the transistor Q3, and the base being connected with a switching controlling circuit 3. The switching transistor Q1 performs switching in accordance with a switching control signal from the switching control circuit 3, and grounds the end of the magnetic head 2.

The switching transistor Q2 is an NPN transistor, the emitter being grounded, the collector being connected with the other end of the magnetic head 2 through the external resistor Ra, and also, being connected with the collector of the transistor Q4, and the base being connected with the switching controlling circuit 3. The switching transistor Q2 performs switching in accordance with a switching control signal from the switching control circuit 3, and grounds the other end of the magnetic head 2.

The switching transistor Q3 is a PNP transistor, a power source voltage Vcc being applied to the emitter, the collector being connected with one end of the magnetic head 2 and connected with the collector of the transistor Q1, and the base being connected with the switching controlling circuit 3. The switching transistor Q3 performs switching in accordance with a switching control signal from the switching control circuit 3, and supplies the writing current to the one end of the magnetic head 2.

The switching transistor Q4 is a PNP transistor, the power source voltage Vcc being applied to the emitter, the collector being connected with the other end of the magnetic head 2 through the external resistor Ra and connected with the collector of the transistor Q2, and the base being connected with the switching controlling circuit 3. The switching transistor Q4 performs switching in accordance with a switching control signal from the switching control circuit 3, and supplies the writing current to the other end of the magnetic head 2.

The switching control circuit 3 supplies the switching control signals, in accordance with the digital signal which is to be recorded, to the transistors Q1 through Q4, respectively.

FIG. 2 illustrates operations of the example of the head amplifier circuit in the related art. FIG. 2 shows the states of the transistors Q1 through Q4. '1' represents the ON state, and '0' represents 'OFF' state.

When each of the transistors Q1 and Q4 is turned on, and each of the transistors Q2 and Q3 is turned off, shown as 'a' in FIG. 2, the terminal Ta of the magnetic head 2 is grounded and the power source voltage Vcc is applied to the terminal Tb. Thereby, the writing current flows through the magnetic head 2 from the terminal Tb to the terminal Ta. At this time, the resistor Ra connected with the magnetic head 2 in series is used for controlling the writing current supplied to the magnetic head 2.

When each of the transistors Q2 and Q3 is turned on, and each of the transistors Q1 and Q4 is turned off, shown as 'd' in FIG. 4, the terminal Tb of the magnetic head 2 is grounded and the power source voltage Vcc is applied to the terminal Ta. Thereby, the writing current flows through the magnetic head 2 from the terminal Ta to the terminal Tb. Also at this time, the resistor Ra connected in series with the magnetic head 2 is used for controlling the writing current supplied to the magnetic head 2.

Further, by turning off any one of the transistor Q1 and Q2, and turning off each of the transistors Q3 and Q4, shown as 'c' and 'd' in FIG. 2, any one of the transistors Q1 and Q2 is grounded, thereby, any one of the terminals Ta and Tb of the magnetic head 2 is grounded. Further, the power source voltage Vcc is not applied to the magnetic head 2. Thus, no writing current flows through the magnetic head 2.

Thus, in the head amplifier circuit in the related art, the switching transistors Q1 through Q4 are used for performing a switching control of connection of the magnetic head 2 with the power source voltage Vcc and the ground, and the resistor Ra connected in series with the magnetic head 2 is used for controlling the writing current.

However, in the head amplifier circuit in the related art, the switching control of supply of the writing current to the magnetic head 2 is performed by the transistors Q1 through Q4. In such an arrangement, there is a possibility that, at the time of switching of the transistors Q1 through Q4, a transitional excessive current flows therethrough.

Further, the writing current supplied to the magnetic head 2 is supplied from the power source voltage Vcc through the transistor Q3 or Q4. Accordingly, the write current depends on the power source voltage Vcc.

SUMMARY OF THE INVENTION

The present invention has been devised in consideration of the above-mentioned points. An object of the present invention is to provide a head amplifier circuit which can stably supply the writing current.

A head amplifier circuit, according to the present invention, is provided for supplying a writing current, having a direction in accordance with a recording information, to a head for recording information on a recording medium, and comprises:

reference voltage generating means for generating a reference voltage;

constant current generating means for generating a constant current based on the reference voltage generated by the reference voltage generating means; and grounding means, wherein, during one period of time, the constant current generating means supplies the constant current to a first end of the head and the grounding means grounds a second end of the head, and, during another period of time, the constant current generating means supplies the constant current to the second end of the head and the grounding means grounds the first end of the head.

A head amplifier circuit, according to another aspect of the present invention, is provided for supplying a writing current, having a direction in accordance with a recording information, to a head for recording information on a recording medium, and comprises:

a reference current generating circuit for generating a reference current based on a reference voltage;

two constant current generating circuits, each for generating a constant current based on the reference current generated by the reference current generating circuit;

two grounding circuits; and switching elements, wherein the switching elements perform switching so that, during one period of time, one of the constant current generating circuits supplies the constant current to a first end of the head and one of the grounding circuits grounds a second end of the head, and, during another period of time, the other one of the constant current generating circuits supplies the constant current to the second end of the head and the other one of the grounding circuits grounds the first end of the head.

In the above-described arrangement, the writing current supplied to the head is generated by either one of the constant current generating circuits each of which generates the constant current based on the reference current generated by the reference current generating circuit. Thereby, it is possible to provide a stable writing circuit.

The head amplifier circuit may further comprise a predetermined voltage supplying circuit, wherein:

the reference current generating circuit comprises a reference voltage generating element for generating the reference voltage, and a constant current circuit for generating the constant current based on the reference voltage generated by the reference voltage generating element;

the switching elements includes two switches, one of the two switches connecting the reference current generating circuit with either one of the two constant current generating circuits, the other one of the two switches causing the predetermined voltage, supplied by the predetermined voltage supplying circuit, to be supplied to either one of the two grounding circuits;

each of the two constant current generating circuits comprises a constant current circuit which generates the constant current when the reference current generating circuit is connected thereto; and each of the two grounding circuits comprises a switching element which is conductive when the predetermined voltage is supplied thereto from the other one of the two switches.

The reference current generating circuit may include an adjusting element for adjusting the reference current to be supplied to either one of the two constant current generating circuits.

In this arrangement, it is possible to adjust the writing current to be suitable for a particular head.

The adjusting element may comprise an externally connected resistor. In this arrangement, merely by selecting the resistor, it is possible to set the writing current to be the optimum one easily at low cost.

Other objects and further features of the present invention will become more apparent from the following detailed description when read in conjunction with the accompanying drawings.

BRIEF DESCRIPTION OF THE DRAWINGS

FIGS. 4A, 4B, 4C, 4D and 4E show operation waveforms of the embodiment of the head amplifier of the present invention.

DETAILED DESCRIPTIONS OF THE PREFERRED EMBODIMENT

Figures 1, 2:
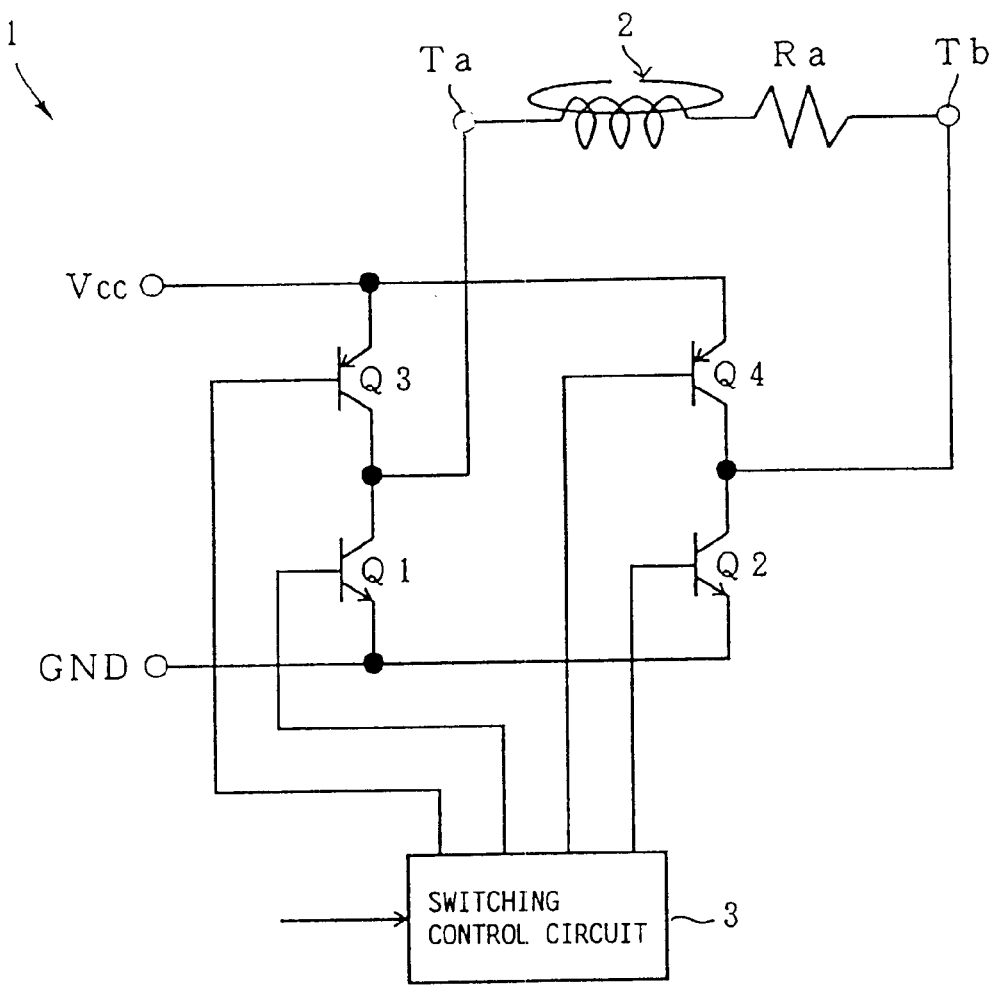
FIG. 1 shows a circuit diagram of one example of a head amplifier circuit in the related art.
FIG. 2 illustrates operations of the head amplifier circuit in the related art.
Figure 3:
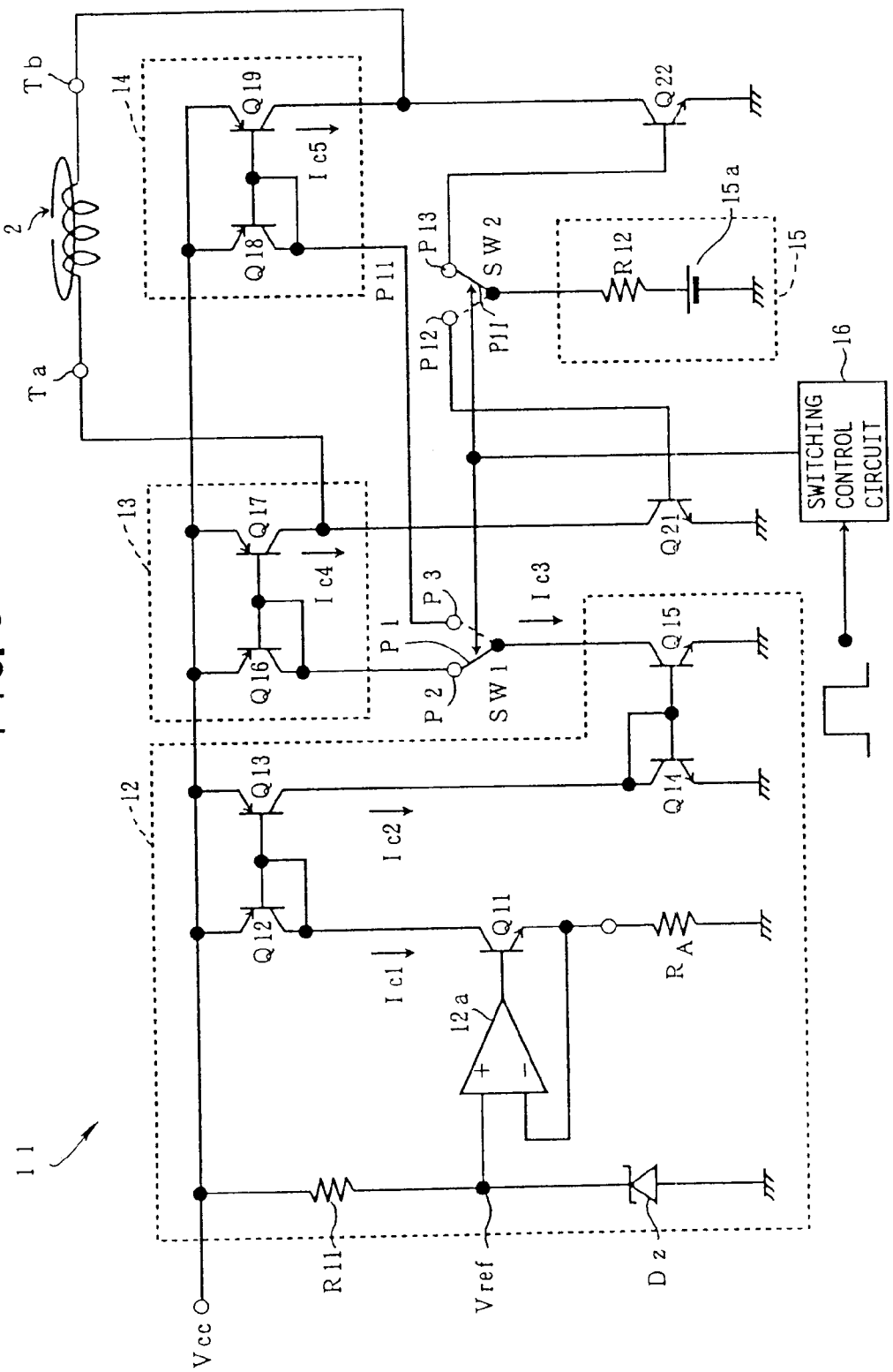
FIG. 3 shows a circuit diagram of one embodiment of a head amplifier circuit of the present invention.

FIG. 3 shows a circuit diagram of one embodiment of a head amplifier circuit of the present invention. In FIG. 3, the same reference numerals are given to the parts/components which are the same as those shown in FIG. 1.

The head amplifier circuit 11 in the embodiment includes several elements. Among them, a reference current generating circuit 12 is provided which generates a reference current. A constant current circuit 13 is provided which generates a constant current in accordance with the reference current generated by the reference current generating circuit 12 and supplies the constant current to one end of a magnetic head 2. Also provided is a constant current circuit 14 which generates a constant current in accordance with the reference current generated by the reference current generating circuit 12 and supplies the constant current to the other end of the magnetic head 2. A switch SW1 is provided between the constant current circuits 13 and 14 for performing switching so as to supply the reference current generated by the reference current generating circuit 12 to one of the constant current circuit 13 and the constant current circuit 14. An ON voltage generating circuit 15 is provided which generates a predetermined ON voltage, and a switching transistor Q21 is provided. The ON voltage generated by the ON voltage generating circuit 15 is supplied to the base of the switching transistor Q21. The switching transistor Q21 is turned on, and the switching transistor Q21 grounds one end Ta of the magnetic head 2, A switching transistor Q22 is also provided and the ON voltage generated by the ON voltage generating circuit 15 is supplied to the base of the switching transistor Q22. The switching transistor Q22 is turned on, and the switching transistor Q22 grounds the other end Tb of the magnetic head 2. A switch SW2 is also provided between the ON voltage generating circuit 15 and the bases of the switching transistors Q21 and Q22 for performing switching so as to supply the ON voltage generated by the ON voltage generating circuit 15 to one of the switching transistors Q21 and Q22. Further provided is a switching control circuit 16 which controls the switches SW1 and SW2 so that the operations of these switches are synchronized with one another.

The reference current generating circuit 12 includes a Zener diode Dz, resistors R11, $R_A$, an operational amplifier 12a, NPN transistors Q11, Q14, Q15, and PNP transistors Q12, Q13. A power source voltage Vcc is applied to one end of the resistor R11, and the cathode of the Zener diode Dz is connected with the other end of the resistor R11. The anode of the Zener diode Dz is grounded.

A current flows through the Zener diode Dz in the reverse direction via the resistor R11, and the Zener voltage Vz is generated at the connection point between the resistor R11 and the Zener diode Dz. This Zener voltage Vz is, as a reference voltage Vref, supplied to a non-inverting input terminal of the operational amplifier 12a. The operational amplifier 12a forms, together with the transistor Q11 and the resistor $R_A$, a constant current circuit, and a constant current Ic1 in accordance with the reference voltage Vref is drawn by the transistor Q11 at the collector thereof.

The collector of the transistor Q11 is connected with the collector and the base of the transistor Q12, and is also connected with the base of the transistor Q13. The transistors Q12 and Q13 form a constant current circuit, and a current Ic2 in accordance with the constant current Ic1 drawn by the transistor Q11 is output from the transistor Q13 at the collector thereof.

The collector of the transistor Q13 is connected with the collector and the base of the transistor Q14, and is also connected with the base of the transistor Q15. The transistors Q14 and Q15 form a constant current circuit and a current Ic3 in accordance with the constant current Ic2 supplied by the transistor Q13 from the collector thereof is as a reference current, drawn by the transistor Q15 at the collector thereof. As constant current $I_{C3}$ is based on constant current $I_{C2}$, while constant current $I_{C2}$ is based on the constant current $I_{C1}$, and current $I_{C1}$ is based on voltage $V_{REF}$, constant current $I_{C3}$ is based on reference voltage $V_{REF}$. The collector of the transistor Q15 is connected with the switch SW1 which switches a circuit from which the current Ic3 is drawn.

The movable contact P1 of the switch SW1 is connected with the collector of the transistor Q15, a fixed contact P2 is connected with the constant current circuit 13 and a fixed contact P3 is connected with the constant current circuit 14.

The switch SW1 is connected with the switching control circuit 16. In the switch SW1, the movable contact P1 is connected with either one of the fixed contact P2 and the fixed contact P3 in accordance with a switching control signal supplied by the switching control circuit 16. When the movable contact P1 is connected with the fixed contact P2 in the switch SW1, the constant current Ic3 is drawn from the constant current circuit 13. When the movable contact P1 is connected with the fixed contact P3 in the switch SW1, the constant current Ic3 is drawn from the constant current circuit 14.

The constant current circuit 13 is formed by the PNP transistors Q16 and Q17. The power source voltage Vcc is applied to the emitter of the transistor Q16, and the collector and base thereof are connected to the fixed contact P2 of the switch SW1.

The power source voltage Vcc is supplied to the emitter of the transistor Q17, the base is connected with the fixed contact P2 and the collector is connected with the terminal Ta of the magnetic head 2. In the constant current circuit 13, when the movable contact P1 is connected with the fixed contact P2 in the switch SW1 and the constant current Ic3 is drawn from the collector and base of the transistor Q16 and the base of the transistor Q17, the transistor Q17 outputs a constant current Ic4 from the collector.

The constant current circuit 14 is formed by the PNP transistors Q18 and Q19. The power source voltage Vcc is applied to the emitter of the transistor Q18, and the collector and the base are connected with the fixed contact P3 of the switch SW1.

The power source voltage Vcc is supplied to the emitter of the transistor Q19, the base is connected with the fixed contact P3 and the collector is connected with the other terminal Tb of the magnetic head 2. In the constant current circuit 14, when the movable contact P1 is connected with the fixed contact P3 in the switch SW1 and the constant current Ic3 is drawn from the collector and base of the transistor Q18 and the base of the transistor Q1, the transistor Q19 outputs a constant current Ic5 from the collector thereof.

The switching transistor Q21 is an NPN transistor. The collector of the switching transistor Q21 is connected with the connection point of the collector of the transistor Q17 of the constant current circuit 13 and the terminal Ta of the magnetic head 2. The base of the switching resistor Q21 is connected with the switch SW2, and the emitter is grounded. The state of the switching transistor Q21 is switched and the terminal Ta of the magnetic head 2 is grounded through the switching transistor Q21.

The switching transistor Q22 is an NPN transistor. The collector of the switching transistor Q22 is connected with the connection point of the collector of the transistor Q19 of the constant current circuit 14 and the other terminal Tb of the magnetic head 2. The base of the switching resistor Q22 is connected with the switch SW2, and the emitter is grounded. The state of the switching transistor Q22 is switched and the other terminal Tb of the magnetic head 2 is grounded through the switching transistor Q21.

The movable contact P11 of the switch SW2 is connected with the ON voltage generating circuit 15, a fixed contact P12 thereof is connected with the base of the switching transistor Q21 and a fixed contact P13 is connected with the base of the switching transistor Q22. In the switch SW2, the ON voltage from the ON voltage generating circuit 15 is supplied to the movable contact P11, and is applied to either one of the fixed contact P12 and the fixed contact P13.

In this arrangement, when the movable contact P11 is connected with the fixed contact P12 in the switch SW2, the switch SW2 supplies the ON voltage from the ON voltage generating circuit 15 to the base of the switching transistor Q21 and turns on the switching transistor Q21. When the movable contact P11 is connected with the fixed contact P13 in the switch SW2, the switch SW2 supplies the ON voltage from the ON voltage generating circuit 15 to the base of the switching transistor Q22 and turns on the switching transistor Q22.

The ON voltage generating circuit 15 includes a constant voltage source 15a and a resistor R12. The ON voltage generating circuit 15 generates the ON voltage which is sufficiently high as to turn on either the switching transistor Q21 or the switching transistor Q22, and supplies the ON voltage to the movable contact P11 of the switch SW2.

The switches SW1 and SW2 are controlled by the switching control circuit 16, and, in accordance with the switching control signal supplied by the switching control circuit 16, switching of the switch SW1 and switching of the switch SW2 is performed in synchronization with one another. For example, when the output of the switching control circuit 16 is at a high level, the movable contact P1 is connected with the fixed contact P2 in the switch SW1 and the movable contact P11 is connected with the fixed contact P13 in the switch SW2. Thereby, the constant current Ic4 is output from the constant current circuit 13, the switching transistor Q21 is in its off state and the switching transistor Q22 is in its on state. The constant current Ic4 is supplied to the terminal Ta of the magnetic head 2, flows therethrough, and flows out from the terminal Tb. The current flowing out from the terminal Tb of the magnetic head 2 flows to the ground through the transistor Q22.

When the output of the switching control circuit 16 is at a low level, the movable contact P1 is connected with the fixed contact P3 in the switch SW1 and the movable contact P11 is connected with the fixed contact P12 in the switch SW2. Thereby, the constant current Ic5 is output from the constant current circuit 14, the switching transistor Q21 is in its on state and the switching transistor Q22 is in its off state. The constant current Ic5 is supplied to the terminal Tb of the magnetic head 2, flows therethrough, and flows out from the terminal Ta of the magnetic head 2. The current flowing out from the terminal Tb of the magnetic head 2 flows to the ground through the transistor Q21.

Here, by forming one chip including the circuits other than the magnetic head 2 and the resistor $R_A$, and externally connecting the resistor $R_A$ to the chip, the resistor $R_A$ having an appropriate resistance can be easily set in accordance with the characteristics of the magnetic head 2. By changing the resistor $R_A$, the constant current Ic1 can be changed in accordance with the change of the resistor $R_A$. Thereby, the constant current Ic3 supplied to the constant current circuits 13 and 14 from the reference current generating circuit 12 can be changed. Thereby, either one of the constant currents Ic4 and Ic5, that is, the writing current, supplied from the respective one of the constant current circuits 13 and 14 to the magnetic head 2, can be easily adjusted.

FIGS. 4A, 4B, 4C, 4D and 4E show operation waveforms of the embodiment of the head amplifier circuit of the present invention. FIG. 4A shows the switching control signal supplied to the switches SW1 and SW2 from the switching control circuit 16. FIG. 4B shows the constant current Ic4 output from the collector of the transistor Q17 of the constant current circuit 13. FIG. 4C shows the constant current Ic5 output from the collector of the transistor Q19 of the constant current circuit 14. FIG. 4D shows the switching states of the switching transistor Q21. FIG. 4E shows the switching states of the switching transistor Q22.

When the switching control signal supplied to the switches SW1 and SW2 from the switching control circuit 16 goes to the high level in response to a digital signal externally supplied to the switching control circuit 16 at a time t1, as shown in FIG. 4A, the movable contact P1 of the switch SW1 is connected with the fixed contact P2, and the movable contact P11 of the switch SW2 is connected with the fixed contact P13.

When the movable contact P1 of the switch SW1 is connected with the fixed contact P2, the collector of the transistor Q15 of the reference current generating circuit 12 is connected with the constant current circuit 13, and the constant current Ic3 is drawn from the constant current circuit 13. When the constant current Ic3 is drawn from the constant current circuit 13, the transistor Q17 of the constant current circuit 13 is turned on. Thereby, as shown in FIG. 4B, the transistor Q17 outputs the constant current Ic4 from the collector. At this time, in the constant current circuit 14, because the connection point of the base and collector of the transistor Q18 and the base of the transistor Q19 is not connected with other components, each of the transistors Q18 and Q19 is turned off, and, as shown in FIG. 4C, the constant current Ic5 is not output.

On the other hand, as a result of the movable contact P11 being connected with the fixed contact P13 as mentioned above, the ON voltage generated by the ON voltage generating circuit 15 is applied to the base of the transistor Q22. Thereby, as shown in FIG. 4E, the switching transistor Q22 is turned on. At this time, because the base of the switching transistor Q21 is not connected with other components, the switching transistor Q21 is turned off, as shown in FIG. 4D.

As a result, because the switching transistor Q21 is in its off state, the output constant current Ic4 of the constant current circuit 13 is supplied to the terminal Ta of the magnetic head 2. Because the switching transistor Q22 is in its on state, the terminal Tb of the magnetic head 2 is grounded therethrough. Thus, the constant current Ic4 generated in the constant current circuit 13 is supplied to the magnetic head 2 and the constant current Ic4 flows from the terminal Ta to the terminal Tb of the magnetic head 2.

When the switching control signal supplied to the switches SW1 and SW2 from the switching control circuit 16 goes to the low level in response to the digital signal externally supplied to the switching control circuit 16 at a time t2, as shown in FIG. 4A, the movable contact P1 of the switch SW1 is connected with the fixed contact P3, and the movable contact P11 of the switch SW2 is connected with the fixed contact P12.

When the movable contact P1 of the switch SW1 is connected with the fixed contact P3, the collector of the transistor Q15 of the reference current generating circuit 12 is connected with the constant current circuit 14, and the constant current Ic3 is drawn from the constant current circuit 14. When the constant current Ic3 is drawn from the constant current circuit 14, the transistor Q19 of the constant current circuit 14 is turned on. Thereby, as shown in FIG. 4C, the transistor Q19 outputs the constant current Ic5 from the collector. At this time, in the constant current circuit 13, because the connection point of the base and collector of the transistor Q16 and the base of the transistor Q17 is not connected with other components, each of the transistors Q16 and Q17 is turned off, and, as shown in FIG. 4B, the constant current Ic4 is not output.

On the other hand, as a result of the movable contact P11 being connected with the fixed contact P12 as mentioned above, the ON voltage generated by the ON voltage generating circuit 15 is applied to the base of the transistor Q21. Thereby, as shown in FIG. 4D, the switching transistor Q21 is turned on. At this time, because the base of the switching transistor Q22 is not connected with other components, the switching transistor Q22 is turned off, as shown in FIG. 4E.

As a result, because the switching transistor Q22 is in its off state, the output constant current Ic5 of the constant current circuit 14 is supplied to the terminal Tb of the magnetic head 2. Because the switching transistor Q21 is in its on state, the terminal Ta of the magnetic head 2 is grounded therethrough. Thus, the constant current Ic5 generated in the constant current circuit 14 is supplied to the magnetic head 2 and the constant current Ic5 flows from the terminal Tb to the terminal Ta of the magnetic head 2. This direction of the constant current Ic5 is reverse of that of the constant current Ic4 flowing through the magnetic head 2 when the switching control signal is at the high level.

Thus, in the embodiment, the writing current supplied to the magnetic head 2 is either the constant current Ic4 or the constant current Ic5 generated by a respective one of the constant current circuits 13 and 14. Therefore, the writing current is not affected by the power source voltage Vcc.

Further, the constant current circuits 13 and 14 generate the constant currents Ic4 and Ic5, respectively, based on the reference voltage Vref which is generated by the Zener diode Dz in the reference current generating circuit 12. As a result, stable constant currents Ic4 and Ic5 can be obtained.

Thereby, recording by the magnetic head 2 on a recording medium such as a floppy disk can be stably performed.

Further, in the embodiment, either one the constant currents, generated in the constant current circuits 13 and 14, respectively, is used as the writing current. Thus, there is no possibility that an excessive current flows through any transistor.

Further, in the embodiment, the constant current circuits 13 and 14 are provided on the power source voltage Vcc side, and the switching transistors Q21 and Q22 are provided on the ground side. However, it is also possible that the constant current circuits 13 and 14 are provided on the ground side, and the switching transistors Q21 and Q22 are provided on the power source voltage Vcc side.

Further, the present invention is not limited to the above-described embodiments, and variations and modifications may be made without departing from the scope of the present invention.

What is claimed is:

1. A head amplifier circuit supplying a writing current, having a direction in accordance with a recording information, to a head for recording information on a recording medium, comprising:
   reference voltage generating means for generating a reference voltage from a power source voltage supplied from a power source voltage-supplying terminal;
   constant current generating means for generating a constant current based on the reference voltage generated by said reference voltage generating means, said constant current generating means being arranged between said power source voltage supplying terminal and said head; and
   grounding means,
   wherein a switching operation is performed in response to a single signal so that, during one period of time, said constant current generating means supplies the constant current to a first end of said head and said grounding means grounds a second end of said head, and, during another period of time, said constant current generating means supplies the constant current to said second end of said head and said grounding means grounds said first end of said head.

2. A head amplifier circuit supplying a writing current, having a direction in accordance with a recording information, to a head for recording information on a recording medium, the head amplifier circuit comprising:
   a reference current generating circuit for generating a reference current based on a reference voltage,
   two constant current generating circuits, each for generating a constant current based on the reference current generated by said reference current generating circuit;
   two grounding circuits; and
   switching elements,
   said switching elements performing switching so that, during one period of time, one of said constant current generating circuits supplies the constant current to a first end of said head and one of said grounding circuits grounds a second end of said head, and, during another period of time, the other one of said constant current generating circuits supplies the constant current to said second end of said head and the other one of said grounding circuits grounds said first end of said head;
   a predetermined voltage supplying circuit,
   wherein:
      said reference current generating circuit comprises a reference voltage generating element for generating the reference voltage, and a constant current circuit for generating the constant current based on the reference voltage generated by said reference voltage generating element;
      said switching elements include two switches, one of said two switches connecting said reference current generating circuit with either one of said two constant current generating circuits, the other one of said two switches causing said predetermined voltage, supplied by said predetermine voltage supplying circuit, to be supplied to either one of said two grounding circuits;
      each of said two constant current generating circuits comprises a constant current circuit which generates the constant current when said reference current generating circuit is connected thereto; and
      each of said two grounding circuits comprises a switching element which is conductive when the predetermined voltage is supplied thereto from said other one of said two switches.

3. The head amplifier circuit according to claim 2, wherein said reference current generating circuit includes an adjusting element for adjusting the reference current to be supplied to either one of said two constant current generating circuits.

4. The head amplifier circuit according to claim 3, wherein said adjusting element comprises an externally connected resistor.

5. A head amplifier circuit supplying a writing current having a direction in accordance with a recording information, to a head for recording information on a recording medium, the head amplifier circuit comprising:
   switching elements;
   a reference current generating circuit for generating a reference current based on a reference voltage generated from a power source voltage supplied from a power source voltage supplying terminal; wherein the reference current generating circuit comprises a constant voltage element (Dz) for generating the reference voltage from the power source voltage, and wherein the constant current generating circuits are connected on the side of the power source while the grounding circuits are connected on the side of the ground, and wherein a single signal source is needed to switch the switching elements;
   two constant current generating circuits, each for generating a constant current based on the reference current generated by said reference current generating circuit; and
   two grounding circuits;
   wherein said switching elements perform switching so that, during one period of time, one of said constant current generating circuits supplies the constant current to a first end of said head and one of said grounding circuits grounds a second end of said head, and, during another period of time, the other one of said constant current generating circuits supplies the constant current to said second end of said head and the other one of said grounding circuits grounds said first end of said head.

6. A head amplifier circuit supplying a writing current, having a direction in accordance with a recording information, to a head for recording information on a recording medium, the head amplifier circuit comprising:
   a reference current generating circuit for generating a reference current based on a reference voltage generated from a power source voltage supplied from a power source voltage supplying terminal;
   two constant current generating circuits, each for generating a constant current based on the reference current generated by said reference current generating circuit;
   two grounding circuits; and
   switching elements;
   wherein a single signal source is needed to switch the switching elements, said switching elements perform switching so that, during one period of time, one of said constant current generating circuits supplies the constant current to a first end of said head and one of said grounding circuits grounds a second end of said head, and, during another period of time, the other one of said constant current generating circuits supplies the constant current to said second end of said head and the other one of said grounding circuits grounds siad first end of said head.

\* \* \* \* \*